United States Patent
Zhong et al.

(10) Patent No.: US 9,590,029 B2
(45) Date of Patent: Mar. 7, 2017

(54) METHOD FOR MANUFACTURING INSULATED GATE BIPOLAR TRANSISTOR

(71) Applicant: CSMC TECHNOLOGIES FAB1 CO., LTD., Wuxi New District (CN)

(72) Inventors: Shengrong Zhong, Wuxi New District (CN); Dongfei Zhou, Wuxi New District (CN); Xiaoshe Deng, Wuxi New District (CN); Genyi Wang, Wuxi New District (CN)

(73) Assignee: CSMC Technologies Fab1 Co., Ltd., Wuxi New District, Jiangsu (CN)

( * ) Notice: Subject to any disclaimer, the term of this patent is extended or adjusted under 35 U.S.C. 154(b) by 0 days.

(21) Appl. No.: 14/902,432

(22) PCT Filed: Aug. 25, 2014

(86) PCT No.: PCT/CN2014/085094
§ 371 (c)(1),
(2) Date: Dec. 31, 2015

(87) PCT Pub. No.: WO2015/027881
PCT Pub. Date: Mar. 5, 2015

(65) Prior Publication Data
US 2016/0380048 A1    Dec. 29, 2016

(30) Foreign Application Priority Data

Aug. 27, 2013 (CN) .......................... 2013 1 0380034

(51) Int. Cl.
*H01L 29/06* (2006.01)
*H01L 29/66* (2006.01)
(Continued)

(52) U.S. Cl.
CPC ........ *H01L 29/0623* (2013.01); *H01L 21/761* (2013.01); *H01L 29/045* (2013.01);
(Continued)

(58) Field of Classification Search
CPC . H01L 29/0623; H01L 21/761; H01L 29/045; H01L 29/1095; H01L 29/16;
(Continued)

(56) References Cited

U.S. PATENT DOCUMENTS

| 4,567,641 A | 2/1986 | Baliga et al. |
| 5,468,982 A | 11/1995 | Hshieh et al. |

(Continued)

FOREIGN PATENT DOCUMENTS

| CN | 1525575 | 9/2004 |
| CN | 101221986 | 7/2008 |

(Continued)

OTHER PUBLICATIONS

International Search Report for PCT/CN2014/085094, dated Nov. 25, 2014, and English language translation, 4 pages total.

(Continued)

*Primary Examiner* — Karen Kusumakar
(74) *Attorney, Agent, or Firm* — Hamre, Schumann, Mueller & Larson, P.C.

(57) ABSTRACT

A method for manufacturing an insulated gate bipolar transistor (100) comprises: providing a substrate (10), forming a field oxide layer (20) on a front surface of the substrate (10), and forming a terminal protection ring (23); performing photoetching and etching on the active region field oxide layer (20) by using an active region photomask, introducing N-type ions into the substrate (10) by using a photoresist as a mask film; depositing and forming a polysilicon gate (31) on the etched substrate (10) of the field oxide layer (20), and forming a protection layer on the polysilicon gate (31); performing junction pushing on an introduction region of the N-type ions, and then forming a carrier enhancement region (41); performing photoetching by using a P well photomask, introducing P-type ions into the carrier enhancement region
(Continued)

(41), and performing junction pushing and then forming a P-body region; performing, by means of the polysilicon gate, self-alignment introduction of N-type ions into the P-body region, and performing junction pushing and then forming an N-type heavily doped region; forming sidewalls on two sides of the polysilicon gate, introducing P-type ions into the N-type heavily doped region, and performing junction pushing and then forming a P-type heavily doped region; and removing the protection layer, and then performing introduction and doping of the polysilicon gate. The method reduces a forward voltage drop disposing the carrier enhancement region.

10 Claims, 5 Drawing Sheets

(51) Int. Cl.
    *H01L 29/739* (2006.01)
    *H01L 29/10* (2006.01)
    *H01L 29/40* (2006.01)
    *H01L 29/16* (2006.01)
    *H01L 29/20* (2006.01)
    *H01L 29/161* (2006.01)
    *H01L 29/04* (2006.01)
    *H01L 21/761* (2006.01)

(52) U.S. Cl.
    CPC .......... *H01L 29/1095* (2013.01); *H01L 29/16* (2013.01); *H01L 29/161* (2013.01); *H01L 29/1608* (2013.01); *H01L 29/20* (2013.01); *H01L 29/401* (2013.01); *H01L 29/407* (2013.01); *H01L 29/408* (2013.01); *H01L 29/66333* (2013.01); *H01L 29/7395* (2013.01)

(58) Field of Classification Search
    CPC ... H01L 29/1608; H01L 29/161; H01L 29/20; H01L 29/401; H01L 29/407; H01L 29/408; H01L 29/66333; H01L 29/7395
    See application file for complete search history.

(56) References Cited

U.S. PATENT DOCUMENTS

| | | |
|---|---|---|
| 5,843,796 A | 12/1998 | Disney |
| 6,403,432 B1 | 6/2002 | Yu et al. |
| 6,429,481 B1 | 8/2002 | Mo et al. |
| 2003/0010998 A1 | 1/2003 | Callaway, Jr. |
| 2003/0027361 A1 | 2/2003 | Lempkowski |
| 2003/0080377 A1 | 5/2003 | Yedinak et al. |
| 2003/0222290 A1* | 12/2003 | Rodov ................ H01L 29/1095 257/282 |
| 2006/0017111 A1 | 1/2006 | Kamiya et al. |
| 2008/0157117 A1 | 7/2008 | McNutt et al. |

FOREIGN PATENT DOCUMENTS

| | | |
|---|---|---|
| CN | 101226961 | 7/2008 |
| CN | 102496573 | 6/2012 |
| CN | 102522335 | 6/2012 |
| CN | 102956687 | 3/2013 |
| CN | 102969243 | 3/2013 |
| EP | 0755077 | 1/1997 |

OTHER PUBLICATIONS

M. Mori et al., "A Planar-Gate High-Conductivity IGBT (HiGT) With Hole-Barrier Layer," IEEE Transactions on Electron Devices, vol. 54, No. 6, Jun. 2007, p. 1515-1520.

Extended European Search Report for European application No. 14839057, dated Jan. 3, 2017 (10 pages).

* cited by examiner

METHOD FOR MANUFACTURING INSULATED GATE BIPOLAR TRANSISTOR

FIELD OF THE INVENTION

The present invention relates to a method of manufacturing a semiconductor device, and particularly relates to a method of manufacturing an insulated gate bipolar transistor.

BACKGROUND OF THE INVENTION

The insulated gate bipolar transistor (IGBT) generally is a power semiconductor device consisting of a bipolar junction transistor (BJT) and a metal oxide semiconductor field effect transistor (MOS). A conduction voltage drop of a conventional insulated gate bipolar transistor is relatively high.

SUMMARY OF THE INVENTION

On the basis of this, it is necessary to provide a method of manufacturing an insulated gate bipolar transistor to manufacture an insulated gate bipolar transistor with a low conduction voltage drop.

A method of manufacturing an insulated gate bipolar transistor comprises: providing a substrate, forming a field oxide layer at a front side of the substrate, photoetching and etching the field oxide layer by using a terminal guard ring photomask, and forming a terminal guard ring by implanting P-type ions to the substrate under the etched area; photoetching and etching the field oxide layer of an active region by using an active region photomask, implanting N-type ions to the substrate by using a photoresist as a mask film, and depositing polysilicon on the substrate where the field oxide layer being etched, forming a protecting layer on the deposited polysilicon; forming a polysilicon gate by photoetching and etching surplus polysilicon and the protecting layer by using a polysilicon photomask, forming a carrier enhanced region after driving-in an implantation area of N-type ions; or photoetching and etching the field oxide layer of the active region by using the active region photomask, implanting N-type ions to the substrate by using the photoresist as the mask film, and then forming the carrier enhanced region after performing a driving-in process, and depositing polysilicon on the substrate where the field oxide layer being etched, forming the protecting layer on the deposited polysilicon, forming a polysilicon gate by photoetching and etching surplus polysilicon and the protecting layer by using a polysilicon photomask; photoetching the carrier enhanced region by using a P well photomask and implanting P-type ions to the carrier enhanced region, and forming a P-body region after performing a driving-in process; self-alignedly implanting N-type ions to the P-body region by using the polysilicon gate, and forming an N-type heavily doped region after performing a driving-in process; forming a spacer at both sides of the polysilicon gate, then implanting P-type ions to the N-type heavily doped region, and forming a P-type heavily doped region after performing a driving-in process; implanting and doping polysilicon to the polysilicon gate after removing the protecting layer; and forming an interlayer dielectric, performing a frontside metalized process of the insulated gate bipolar transistor, performing backgrinding, implanting of P-type ions and an annealing process, and performing a backside metalized process of the insulated gate bipolar transistor.

In one of embodiments, after forming the spacer at both sides of the polysilicon gate and prior to implanting-type ions to the N-type heavily doped region, the method further comprises forming a dishing area by etching the N-type heavily doped region, wherein an inwardly dishing depth of the dishing area with respect to the substrates of both sides is 0.15 micron to 0.3 micron.

In one of embodiments, forming the protecting layer on the deposited polysilicon comprises forming a first oxide layer at a surface of the polysilicon, and depositing a silicon nitride layer at a surface of the first oxide layer.

In one of embodiments, after performing the frontside metalized process of the insulated gate bipolar transistor, the method further comprises implanting P-type ions to the P-type heavily doped region again.

In one of embodiments, in the step of forming the terminal guard ring by implanting P-type ions to the substrate under the etched area, the P-type ions are boron ions; in the step of implanting N-type ions to the substrate by using a photoresist as a mask film, the N-type ions are phosphorous ions; in the step of photoetching the carrier enhanced region by using a P well photomask and implanting P-type ions to the carrier enhanced region, the P-type ions are boron ions; in the step of self-alignedly implanting N-type ions to the P-body region by using the polysilicon gate, the N-type ions are arsenic ions; in the step of implanting P-type ions to the N-type heavily doped region, the P-type ions are boron ions; in the step of implanting and doping polysilicon to the polysilicon gate after removing the protecting layer, the implanted ions are phosphorous ions.

In one of embodiments, forming the spacer at both sides of the polysilicon gate comprises: depositing a second oxide layer, then removing a surplus of the second oxide layer by corroding, and forming the spacer by using the remaining part of the second oxide layer.

In one of embodiments, performing the frontside metalized process of the insulated gate bipolar transistor comprises forming a contact hole by performing photoetching and etching processes by using a contact hole photomask, and sputtering a conductive metal on the interlayer dielectric, then forming a metal lead layer covering the interlayer dielectric by photoetching and etching the sputtered metal by using a metal photomask.

In one of embodiments, the substrate is made of silicon, silicon carbide, gallium arsenide, indium phosphide orgermanium-silicon.

In one of embodiments, the substrate is made of monocrystal silicon with a crystal orientation of <100>.

In one of embodiments, forming the interlayer dielectric comprises depositing borophosphosilicate glass and performing a hot reflow process, then forming the interlayer dielectric covering the surfaces of the polysilicon gate and the spacer.

In the method of manufacturing the insulated gate bipolar transistor described above, when a field oxide layer of an active region area is etched by using an active region photomask, implantation of N-type ions is performed, for increasing a concentration of carriers in a channel to form a carrier enhanced region and then reduce the conduction voltage drop.

DETAILED DESCRIPTION OF THE EMBODIMENTS

The details of one or more embodiments of the invention are set forth in the accompanying drawings and the description below. Other features, objects, and advantages of the invention will be apparent from the description and drawings, and from the claims.

Figure 1:
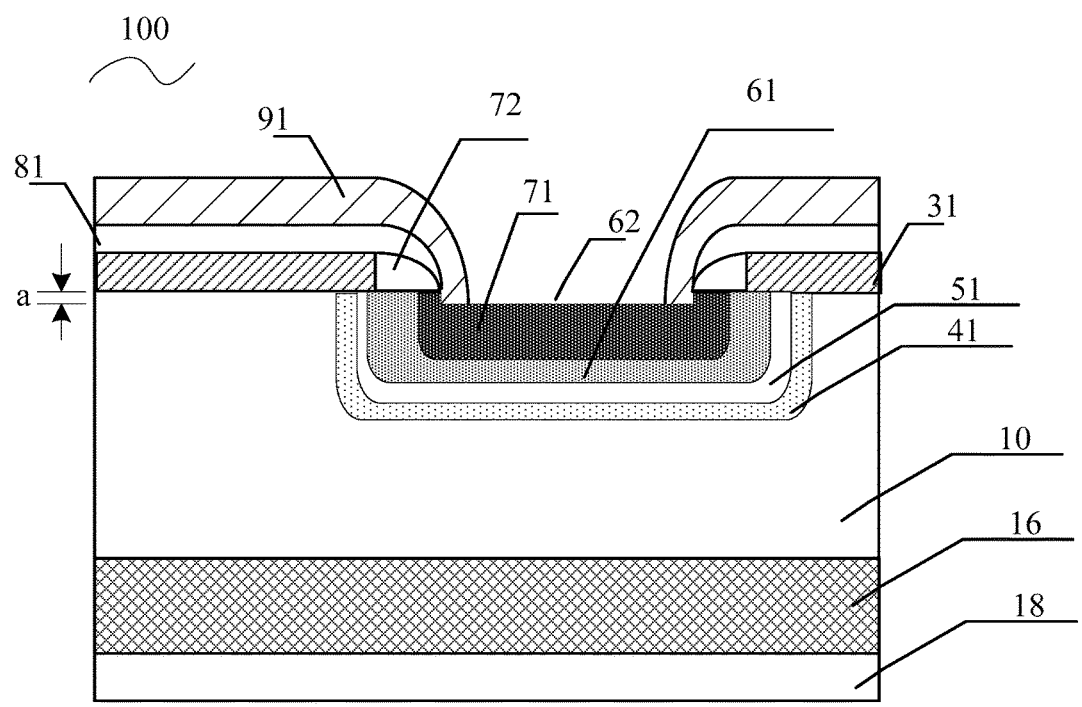
FIG. 1 is a schematic view of the insulated gate bipolar transistor in an embodiment.

FIG. 1 is a schematic view of the insulated gate bipolar transistor 100 in an embodiment, which includes a peripheral terminal structure (not shown in FIG. 1) and an active region surrounded by the terminal structure. A substrate of the insulated gate bipolar transistor 100 is an N-type substrate 10. A back side of the substrate 10 is disposed with a P-type region 16, a back side of the P-type region 16 is disposed with a backside metal structure 18, and a terminal guard ring (not shown in FIG. 1) is disposed in the terminal structure. A front side of the substrate 10 of the active region is disposed with a polysilicon gate 31, both sides of the polysilicon gate 31 on the substrate 10 are disposed with the spacers 72, an interlayer dielectric 81 covering the polysilicon gate 31 and the spacers 72 is disposed on the substrate 10, and the interlayer dielectric 81 is covered by a metal lead layer 91. An N-type carrier enhanced region 41 is disposed in the substrate 10 of the active region, a P-body region 51 is disposed in the carrier enhanced region 41, an N-type heavily doped region 61 is disposed in the P-body region 51, a P-type heavily doped region 71 is disposed in the N-type heavily doped region 61, a dishing area 62 dishing inwardly is formed at a surface of the P-type heavily doped region 71, and an inwardly dishing depth (i.e. a in FIG. 1) of the dishing area 62 with respect to the substrates at both sides is 0.15 micron to 0.3 micron.

Figure 2:
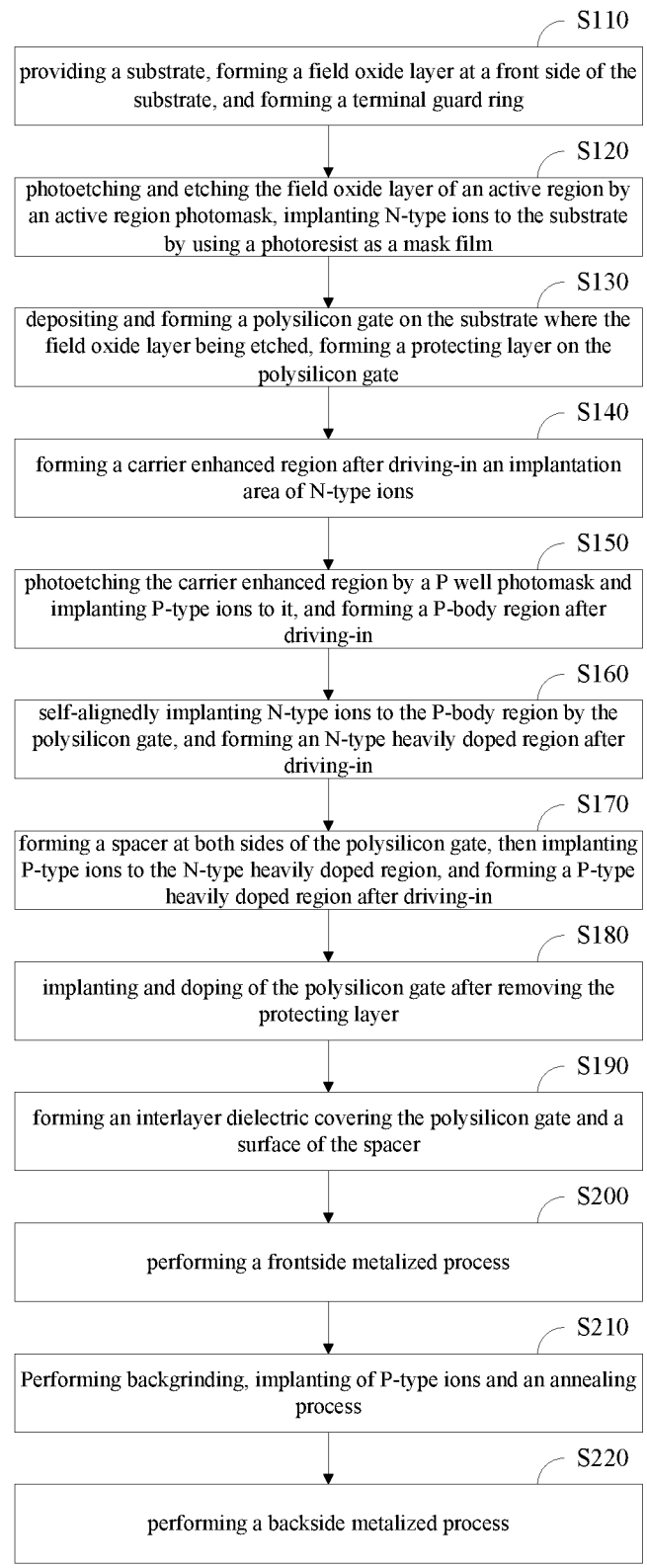
FIG. 2 shows a flow chart of a method of manufacturing the insulated gate bipolar transistor in an embodiment.

Referring to FIG. 2, a method of manufacturing the insulated gate bipolar transistor 100 described above is also provided in the invention, which includes the following steps:

In step S110, a substrate is provided, a field oxide layer is formed at a front side of the substrate and a terminal guard ring is formed.

The substrate 10 is made of silicon, silicon carbide, gallium arsenide, indium phosphide orgermanium-silicon. In the embodiment, the substrate 10 is made of monocrystal silicon wafer with a crystal orientation of <100>.

Figure 3A:
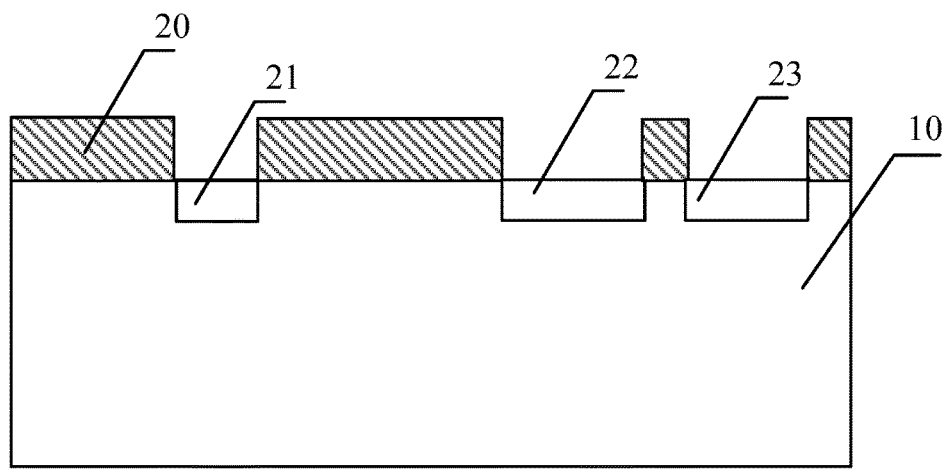
FIGS. 3A to 3F are partial cross-section views during manufacturing the insulated gate bipolar transistor by using the method of manufacturing the insulated gate bipolar transistor in an embodiment.

In the embodiment, firstly a field oxide layer 20 is grown at the front side of the substrate 10, then the field oxide layer 20 is photoetched and etched directly above the substrate 10 required to form the terminal guard ring by using a terminal guard ring photomask. Then the terminal guard ring is formed through implanting of the P-type ions by using the field oxide layer 20 as a masking layer. Three terminal guard rings 21, 22, 23 are shown in FIG. 3A, wherein a position where the terminal guard ring 23 is located is adjacent to the active region area in the center of the substrate 10. It should be understood that the number of the terminal guard rings is not limited to the present embodiment, and can be selected and configured according to actual requirement for the device by those skilled in the art.

FIG. 3A is a partial cross-section view of the insulated gate bipolar transistor after the step S110 is performed in the embodiment. In the embodiment, the P-type ions implanted in the step S110 are boron ions. It should be understood that the particularly implanted P-type/N-type ions given in each step of implanting of ions in the embodiment are only better embodiments, and in other embodiments they can be replaced with other P-type/N-type ions well known by those skilled in the art.

In step S120, the field oxide layer of the active region area is photoetched and etched by using the active region photomask, and the N-type ions are implanted to the substrate by using a photoresist as a mask film.

Figure 3B:
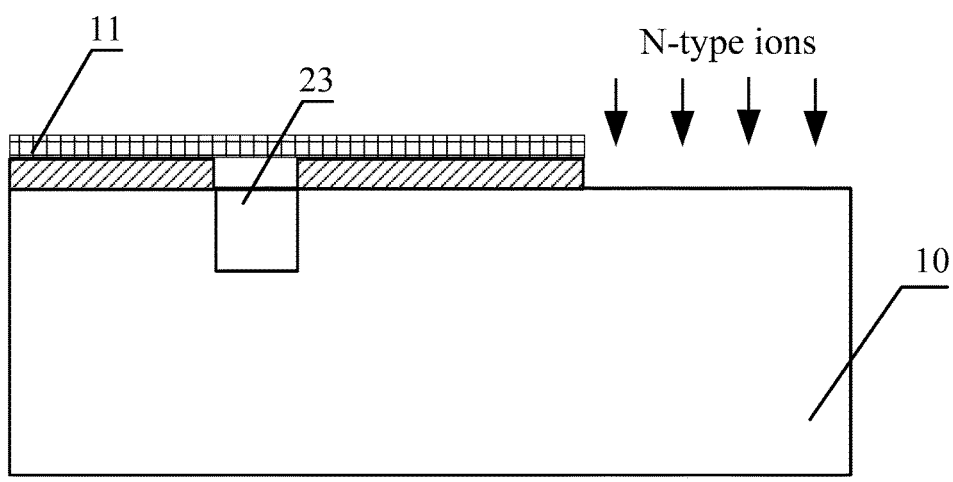

The field oxide layer 20 of the active region area is photoetched and etched by using the active region photomask, then the photoresist is not removed and the N-type ions are implanted to the substrate 10 by using the photoresist as a mask film. In the embodiment, the N-type ions implanted in step S120 are phosphorous ions. FIG. 3B is a partial cross-section view of the insulated gate bipolar transistor after the step S120 is performed in the embodiment, the structure shown by which is located at the right side of FIG. 3A.

In step S130, a polysilicon gate is deposited and formed on the substrate where the field oxide layer is etched, and a protecting layer is formed on the polysilicon gate.

Polysilicon is deposited on the substrate 10 where the field oxide layer 20 is etched, the protecting layer is formed on the deposited polysilicon, and the polysilicon gate 31 is formed by photoetching and etching surplus polysilicon and the protecting layer by using a polysilicon photomask. In the embodiment, the protecting layer is a silicon nitride layer 32, wherein prior to depositing silicon nitride it needs to perform one time oxidation. A first oxide layer (not shown in FIG. 3C) is formed at a surface of the deposited polysilicon, and then the silicon nitride layer 32 is formed on the first oxide layer by depositing the silicon nitride. Compared to depositing the silicon nitride directly on the surface of the polysilicon, a first oxide layer is deposited between the polysilicon gate 31 and the silicon nitride layer 32, which can improve the issue related to stress.

Figure 3C:
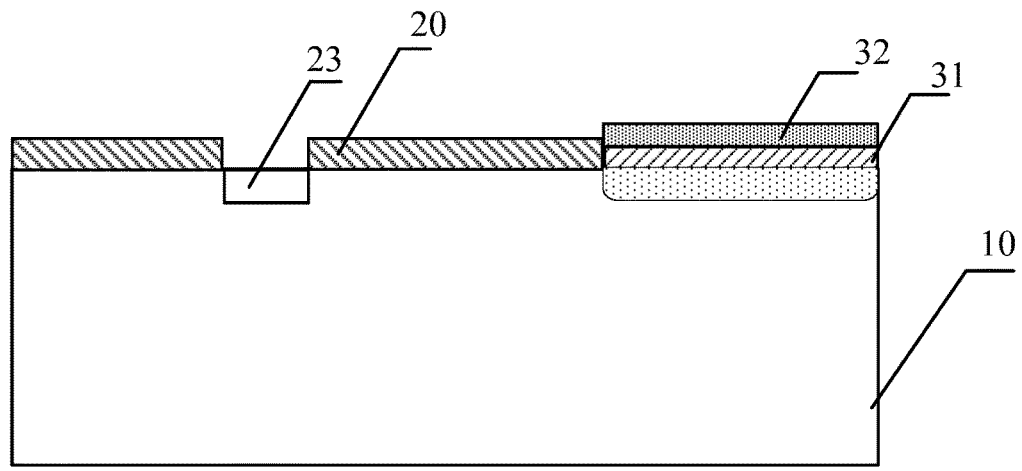

FIG. 3C is a partial cross-section view of the insulated gate bipolar transistor after the step S130 is performed in the embodiment.

In step S140, a carrier enhanced region is formed after driving-in an implantation area of N-type ions.

The carrier enhanced region 41 is formed by the implantation area of N-type ions in step S120 after which is drived-in.

In other embodiments, the order of steps S130 and S140 can be changed, that is to say, after the step S120 of implanting N-type ions, firstly a high temperature driving-in process is performed to form the carrier enhanced region 41, and then the polysilicon gate 31 and the silicon nitride layer 32 are formed.

In step S150, the carrier enhanced region is photoetched by using a P well photomask and P-type ions are implanted to the carrier enhanced region, and then a P-body region is formed after performing a driving-in process.

Figure 3D:
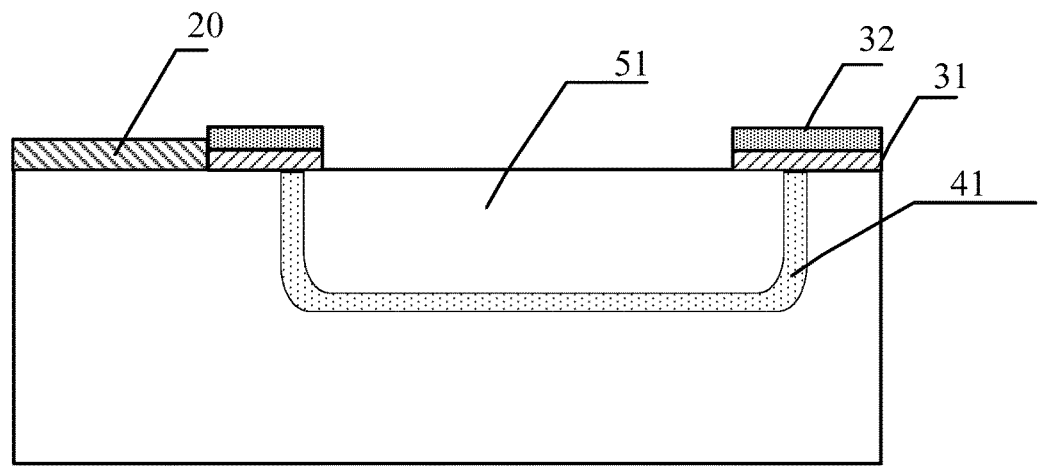

In the embodiment, the P-type ions implanted in step S150 are boron ions, and the P-body region 51 is formed after performing the high temperature driving-in process. FIG. 3D is a partial cross-section view of the insulated gate bipolar transistor after the step S150 is performed in the embodiment, the structure shown by which is located at the right side of FIG. 3C.

In step S160, N-type ions are self-alignedly implanted to the P-body region by using the polysilicon gate, and an N-type heavily doped region is formed after performing a driving-in process.

Figure 3E:
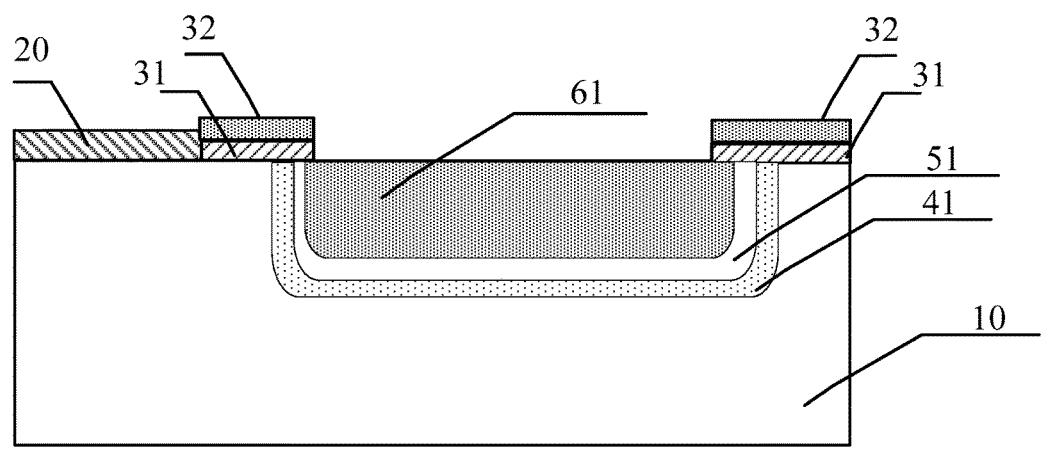

In the embodiment, the N-type ions implanted in step S160 are arsenic ions, and the N-type heavily doped region (NSD) 61 is formed after performing the high temperature driving-in process. FIG. 3E is a partial cross-section view of the insulated gate bipolar transistor after the step S160 is performed in the embodiment.

In step S170, a spacer is formed at both sides of the polysilicon gate, then P-type ions are implanted to the N-type heavily doped region, and a P-type heavily doped region is formed after performing a driving-in process.

Firstly a second oxide layer is deposited, then a spacer corrosion process is performed for the device to corrode a surplus of the second oxide layer, for forming the spacer 72 at both sides of the polysilicon gate 31.

In the embodiment, after forming the spacer 72, and prior to implanting the P-type ions to the N-type heavily doped region 61, the method further comprises silicon-etching the N-type heavily doped region 61 and forming a dishing area. The dishing area 62 is a shallow dishing the inwardly dishing depth of which is 0.15 micron to 0.3 micron.

Prior to implanting the P-type ions to the N-type heavily doped region 61, the shallow dishing (the dishing area 62) of 0.15 micron to 0.3 micron is formed by etching the P-type heavily doped region, which results in a better impurity distribution and a greater metal contacting area for the device, reducing the power consumption, improving reliability of product, and further reducing the conduction voltage drop.

After forming the etched dishing area 62, the P-type ions are implanted. In the embodiment, the implanted P-type ions are boron ions. After performing the implantation process, the high temperature driving-in process is performed to form the P-type heavily doped region (PSD) 71.

In step S180, the implantation and doping processes are performed for the polysilicon gate after removing the protecting layer.

Figure 3F:
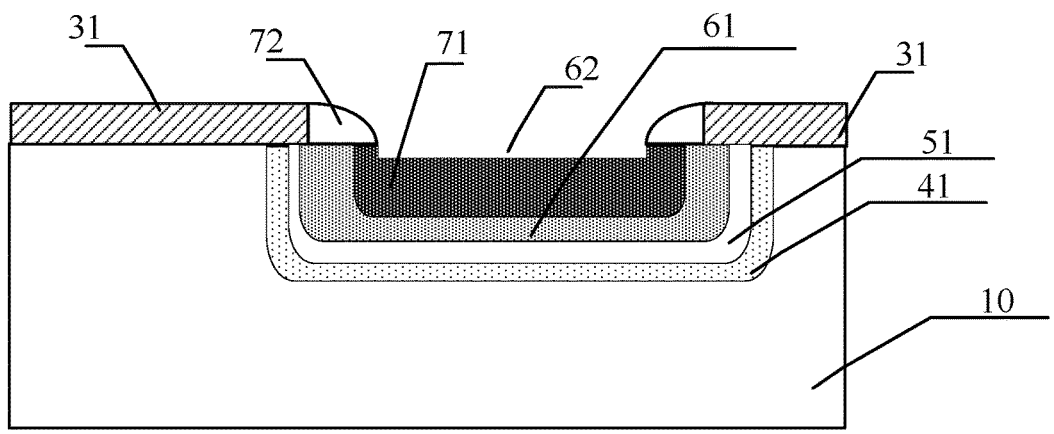

As mentioned previously, the protecting layer in the embodiment is the silicon nitride layer 32. After removing the silicon nitride layer 32 at the surface of the polysilicon gate 31, the N-type ions are implanted and doped to the polysilicon gate 31. In the embodiment, the implantation and doping processes for the polysilicon gate are performed after performing the photoetching process by using the polysilicon photomask. FIG. 3F is a partial cross-section view of the insulated gate bipolar transistor after the step S180 is performed in the embodiment.

After the step S180 is performed, the interlayer dielectric (ILD) can be generated regularly, and the processes of frontside metallization, backgrinding, implantation and annealing, backside metallization and so on can be performed. Similarly, a specific embodiment is described as follows:

In step S190, an interlayer dielectric covering the surfaces of the polysilicon gate and the spacer is formed.

After depositing borophosphosilicate glass (BPSG) at the surface of the device, a hot reflow process is performed, for forming the interlayer dielectric 81 covering the surfaces of the polysilicon gate 31 and the spacer 72.

In step S200, the frontside metallization process is performed.

A contact hole is formed by performing photoetching and etching processes by using a contact hole photomask, and a conductive metal is sputtered at the surface of the device, then the conductive metal is etched by using a metal photomask, and a metal lead layer 91 covering the interlayer dielectric 81 is formed.

In step S210, the processes of backgrinding, P-type ions implantation and annealing are performed.

The back side of the substrate 10 is ground to the required thickness, the P-type ions are implanted to the back side of the substrate 10 and the annealing process is performed, for forming a P-body region 16. A substrate PN junction is formed by the P-body region 16 and the substrate 10. In the embodiment, the P-type ions implanted in the step S210 are boron ions.

In step S220, the backside metallization process is performed.

The conductive metal is sputtered at the back side of the substrate 10, and a backside metal structure 18 is formed at the surface of the P-type region 16 as the collector metal lead. FIG. 1 is a partial cross-section view of the insulated gate bipolar transistor 100 after the step S220 is performed in the embodiment.

In the method of manufacturing an insulated gate bipolar transistor described above, when the field oxide layer 20 of the active region area is etched by using the active region photomask in the step S120, the phosphorous ions is implanted, for increasing the concentration of the carrier in the channel, forming a carrier enhanced region 41 and then reducing the conduction voltage drop.

Six photomasks are used during the above manufacturing process, and are the terminal guard ring photomask, the active region photomask, the polysilicon photomask, the P well photomask, the contact hole photomask and the metal photomask. The ions implantation of the carrier enhanced region 41 directly uses the photoresist formed by photoetching in the step S120 as the mask film, and it does not need to manufacture an additional photomask for the ions implantation of the carrier enhanced region 41, which saving cost.

Further, after the P-type heavily doped region 71 is manufactured, implanting and doping for the polysilicon gate 31 is performed, thus such implanting and doping processes are performed after the above five high temperature driving-in processes are performed, avoiding the influence of the doped ions in the polysilicon during such high temperature processes to the gate oxide and channel region, and solving the difficult problem that the gate oxide can be destroyed easily during the hot process. Meanwhile, the method of manufacturing the insulated gate bipolar transistor is compatible with the DMOS process, and has the advantages of universality, portability for different IC production lines and so on.

In one of embodiments, after forming the contact hole by performing photoetching and etching processes by using the contact hole photomask in step 5200, and prior to sputtering a metal, the PSD implantation can be also performed again, for implanting P-type ions to the P-type heavily doped region to obtain a good ohm contact and improve performance of the device.

Although the invention is illustrated and described herein with reference to specific embodiments, the invention is not intended to be limited to the details shown. Rather, various modifications may be made in the details within the scope and range of equivalents of the claims and without departing from the invention.

What is claimed is:

1. A method of manufacturing an insulated gate bipolar transistor, comprising:
   providing a substrate, forming a field oxide layer at a front side of the substrate, photoetching and etching the field oxide layer by using a terminal guard ring photomask, and forming a terminal guard ring by implanting P-type ions into the substrate under an etched area;

photoetching and etching the field oxide layer on an active region by using an active region photomask, implanting N-type ions to the substrate by using a photoresist as a mask film, and depositing polysilicon on the substrate where the field oxide layer being etched, forming a protecting layer on the deposited polysilicon; forming a polysilicon gate by photoetching and etching surplus polysilicon and the protecting layer by using a polysilicon photomask, forming a carrier enhanced region after driving-in an implantation area of N-type ions; or photoetching and etching the field oxide layer of the active region by using the active region photomask, implanting N-type ions to the substrate by using the photoresist as the mask film, and then forming the carrier enhanced region after performing a driving-in process, and depositing polysilicon on the substrate where the field oxide layer being etched, forming the protecting layer on the deposited polysilicon, forming a polysilicon gate by photoetching and etching surplus polysilicon and the protecting layer by using a polysilicon photomask;

photoetching the carrier enhanced region by using a P well photomask and implanting P-type ions to the carrier enhanced region, and forming a P-type body region after performing a driving-in process;

self-alignedly implanting N-type ions to the P-body region by using the polysilicon gate, and forming an N-type heavily doped region after performing a driving-in process;

forming a spacer at both sides of the polysilicon gate, then implanting P-type ions to the N-type heavily doped region, and forming a P-type heavily doped region after performing a driving-in process;

implanting and doping polysilicon to the polysilicon gate after removing the protecting layer; and forming an interlayer dielectric, performing a frontside metalized process of the insulated gate bipolar transistor, performing backgrinding, implanting of P-type ions and an annealing process, and performing a backside metalized process of the insulated gate bipolar transistor.

2. The method of manufacturing the insulated gate bipolar transistor of claim 1, characterized in that, after forming the spacer at both sides of the polysilicon gate and prior to implanting P-type ions to the N-type heavily doped region, the method further comprises forming a dishing area by etching the N-type heavily doped region, wherein an inwardly dishing depth of the dishing area with respect to the substrates at both sides is 0.15 micron to 0.3 micron.

3. The method of manufacturing the insulated gate bipolar transistor of claim 1, characterized in that, forming the protecting layer on the deposited polysilicon comprises forming a first oxide layer at a surface of the polysilicon, and depositing a silicon nitride layer at a surface of the first oxide layer.

4. The method of manufacturing the insulated gate bipolar transistor of claim 1, characterized in that, after performing the frontside metalized process of the insulated gate bipolar transistor, the method further comprises implanting P-type ions to the P-type heavily doped region again.

5. The method of manufacturing the insulated gate bipolar transistor of claim 1, characterized in that, in the step of forming the terminal guard ring by implanting P-type ions to the substrate under the etched area, the P-type ions are boron ions; in the step of implanting N-type ions to the substrate by using a photoresist as a mask film, the N-type ions are phosphorous ions; in the step of photoetching the carrier enhanced region by using a P well photomask and implanting P-type ions to the carrier enhanced region, the P-type ions are boron ions; in the step of self-alignedly implanting N-type ions to the P-body region by using the polysilicon gate, the N-type ions are arsenic ions; in the step of implanting P-type ions to the N-type heavily doped region, the P-type ions are boron ions; in the step of implanting and doping polysilicon to the polysilicon gate after removing the protecting layer, the implanted ions are phosphorous ions.

6. The method of manufacturing the insulated gate bipolar transistor of claim 1, characterized in that, forming the spacer at both sides of the polysilicon gate comprises: depositing a second oxide layer, then removing a surplus of the second oxide layer by corroding, and forming the spacer by using the remaining part of the second oxide layer.

7. The method of manufacturing the insulated gate bipolar transistor of claim 1, characterized in that, performing the frontside metalized process of the insulated gate bipolar transistor comprises forming a contact hole by performing photoetching and etching processes by using a contact hole photomask, and sputtering a conductive metal on the interlayer dielectric, then forming a metal lead layer covering the interlayer dielectric by photoetching and etching the sputtered metal by using a metal photomask.

8. The method of manufacturing the insulated gate bipolar transistor of claim 1, characterized in that, the substrate is made of silicon, silicon carbide, gallium arsenide, indium phosphide orgermanium-silicon.

9. The method of manufacturing the insulated gate bipolar transistor of claim 8, characterized in that, the substrate is made of monocrystal silicon with a crystal orientation of <100>.

10. The method of manufacturing the insulated gate bipolar transistor of claim 8, characterized in that, forming the interlayer dielectric comprises depositing borophosphosilicate glass and performing a hot reflow process, then forming the interlayer dielectric covering the surfaces of the polysilicon gate and the spacer.

* * * * *